(12) United States Patent
Wong et al.

(10) Patent No.: US 6,538,884 B1
(45) Date of Patent: Mar. 25, 2003

(54) METHOD AND APPARATUS FOR REMOVING HEAT FROM A COMPONENT

(75) Inventors: Henry Wong, Tempe, AZ (US); Thomas J. Bertram, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/960,017

(22) Filed: Sep. 21, 2001

(51) Int. Cl.[7] .................................................. H05K 7/20
(52) U.S. Cl. ................. 361/688; 165/80.3; 165/104.33; 165/185; 174/15.1; 357/715; 361/700; 361/704; 361/710; 361/715; 361/720
(58) Field of Search ............................. 165/80.2, 80.3, 165/185, 104.33; 174/16.3, 15.1; 257/706–707, 712–713, 714–715; 361/687–688, 700–704, 707, 709–710, 715, 719–720, 711

(56) References Cited

U.S. PATENT DOCUMENTS

| | | | |
|---|---|---|---|
| 4,931,904 A | | 6/1990 | Yiu |
| 5,343,940 A | * | 9/1994 | Jean ....................... 165/104.33 |
| 5,390,734 A | * | 2/1995 | Voorhes et al. .............. 165/185 |
| 5,409,055 A | * | 4/1995 | Tanaka et al. ......... 165/104.33 |
| 5,472,043 A | * | 12/1995 | Larson et al. .......... 165/104.33 |
| 5,613,906 A | | 3/1997 | Kikinis |
| 5,986,887 A | | 11/1999 | Smith et al. |
| 6,122,169 A | * | 9/2000 | Liu et al. ..................... 361/700 |
| 6,246,582 B1 | * | 6/2001 | Habing et al. .............. 361/704 |
| 6,377,459 B1 | * | 4/2002 | Gonsalves et al. .......... 361/700 |
| 6,407,916 B1 | * | 6/2002 | Konstad ..................... 361/687 |

* cited by examiner

Primary Examiner—Gregory Thompson
(74) Attorney, Agent, or Firm—Kevin D. Wills

(57) ABSTRACT

An apparatus for removing heat (118) from a component (102) located on a surface (104) of an electronics module (100). The apparatus includes a heat removal device (108) mounted to electronics module (100) a radial distance (110) away from component (102) and a heat conductor (112) having a first portion (115) coupled to component (102) and a second portion (117) coupled to heat removal device (108). A method for removing heat (118) from a component (102) on a surface (104) of an electronics module (100) includes generating heat (118), conveying the heat from the component (102) by way of a heat conductor (112) and depositing the heat (118) to a heat removal device mounted to the electronics module (100)

18 Claims, 5 Drawing Sheets

METHOD AND APPARATUS FOR REMOVING HEAT FROM A COMPONENT

BACKGROUND OF THE INVENTION

The heat generated by electronic components/assemblies during operation must be removed to prevent overheating and failure. Many methods exist to achieve this such as conduction, natural convection, forced convection, and radiation. Heat removal devices used specifically for electronic cooling include fans, heat sinks, thermo-electric coolers, phase change materials, liquids, etc. Two opposing trends are making the cooling problem more difficult. First, the increase in performance of electronics components/assemblies has resulted in an increase in the amount of heat generated. Second, the demand for additional electronic functionality in either the same physical size or a smaller size has resulted in less available space for heat removal devices.

One common cooling scheme consists of a heat sink located within an electronics enclosure, mounted separately from any particular electronics board, that conducts heat away from a series of components or electronics modules, usually with the assistance of one or more fans. Another common scheme is placing a heat sink directly on top of an electronic component. These common cooling schemes require a larger electronic assembly in order to accommodate additional heat transfer devices. In cases where heat removal is not directed at a specific component, the cooling capacity of the overall system must be increased, thereby increasing the cost and decreasing the efficiency of the cooling system.

Accordingly, there is a significant need for an apparatus and method of providing cooling to electronic components that overcome the deficiencies of the prior art outlined above.

BRIEF DESCRIPTION OF THE DRAWINGS

Referring to the drawing.

Figure 1:
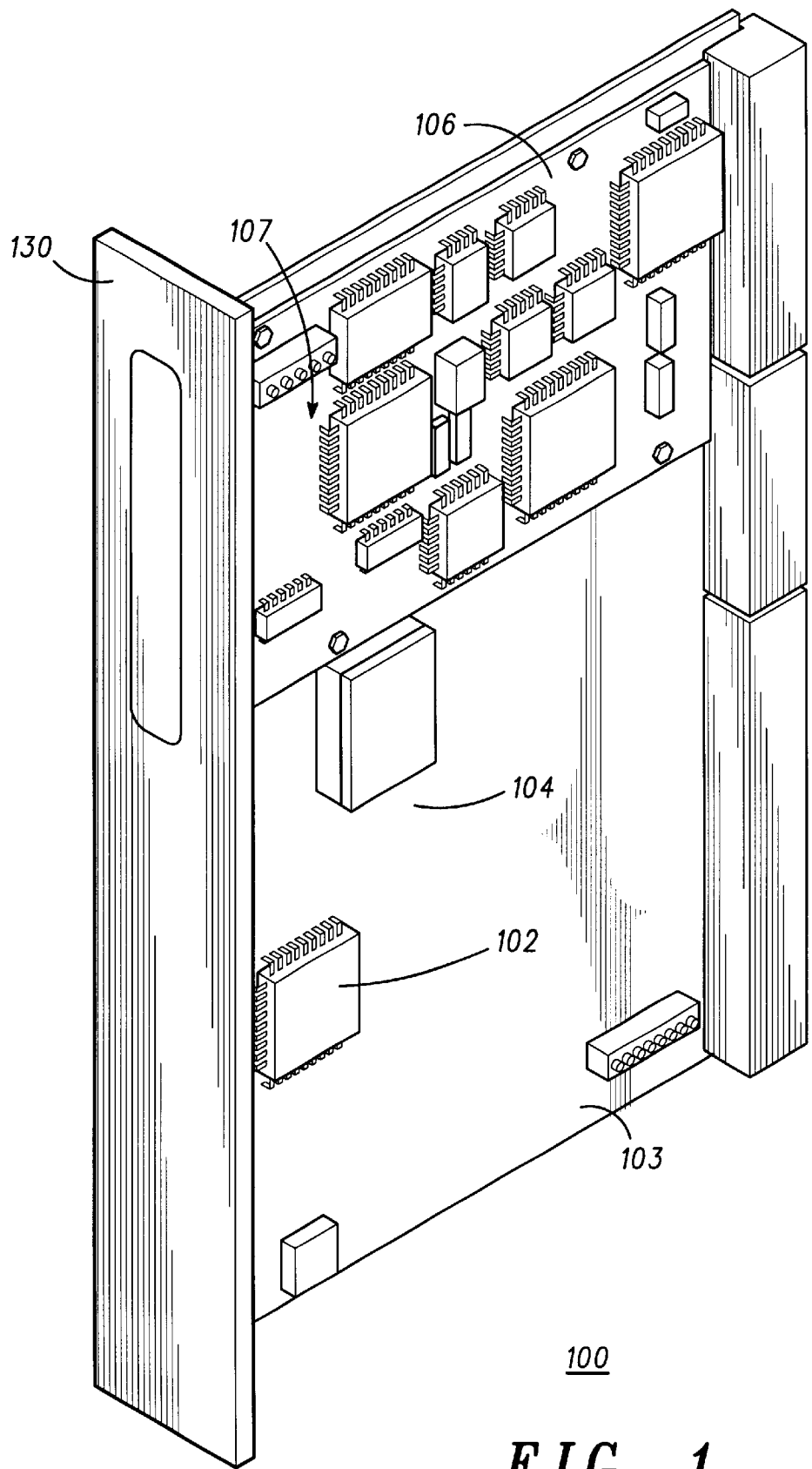
FIG. 1 is an isometric of an electronic module.

It will be appreciated that for simplicity and clarity of illustration, elements shown in the drawing have not necessarily been drawn to scale. For example, the dimensions of some of the elements are exaggerated relative to each other. Further, where considered appropriate, reference numerals have been repeated among the Figures to indicate corresponding elements.

DESCRIPTION OF THE PREFERRED EMBODIMENTS

In the following detailed description of exemplary embodiments of the invention, reference is made to the accompanying drawings (where like numbers represent like elements), which form a part hereof, and in which is shown by way of illustration specific exemplary embodiments in which the invention may be practiced. These embodiments are described in sufficient detail to enable those skilled in the art to practice the invention, but other embodiments may be utilized and logical, mechanical, electrical and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact. However, "coupled" may also mean that two or more elements are not in direct contact with each other, but yet still co-operate or interact with each other.

A common feature in electronic modules is to have configurable Input/Output (IO) modules where a user can add or remove functionality to the module by the choice of the IO module. Examples include add on cards for a computers, etc. In certain situations where the amount of heat generated by the electronics exceeds the electronics module's capabilities to remove the heat, additional heat removal relief can be obtained by using an IO module designed specifically to remove a portion of the heat, without increasing the overall size of the electronic module.

FIG. 1 is an isometric of an electronics module 100. As shown in FIG. 1, electronics module 100 can include a board 103, such as a motherboard, removable circuit board, and the like, which couples to and operates with a computer or other electronic device (not shown for clarity). Included on electronics module 100 are one or more components 102. In an embodiment of the invention, component 102 can be a processor, application specific integrated circuit (ASIC) random access memory (RAM), and the like. Component 102, like other electrical devices, consume electrical power and dissipate much of the power as heat. Higher circuit densities and higher operating speeds cause component 102 to consume greater amounts of power and dissipate greater amounts of heat.

In the embodiment shown in FIG. 1, electronics module 100 includes a host board 103 having a front panel 130 and a surface 104. One or more components 102 are located on surface 104 of electronics module 100. Although the invention is applicable to one or more components, only one component 102 will be used as an exemplary embodiment of the invention. Electronics module 100 may also include one or more mezzanine cards 106 and mezzanine card sites 107. In general, mezzanine cards are deployed on a variety of electronics modules 100 to provide front panel input/output (I/O), additional functionality, and the like. Although any type of mezzanine card 106 and mezzanine card site 107 is within the scope of the invention, an exemplary embodiment may be a common mezzanine card (CMC) and CMC site as specified and set forth in the Institute of Electrical and Electronics Engineers (IEEE) standard P1386, which is herein incorporated herein by reference. A particular example of an embodiment is a peripheral component interconnect (PCI) mezzanine card, also known as a PMC. The mezzanine card, which fits into the PMC site, is known as a PMC module. The parameters and specifications of a PMC module and a PMC module site, including physical dimensions, number of connectors, location of connectors, electrical specifications, and the like, are also specified in IEEE standard P1386.

Figure 2:
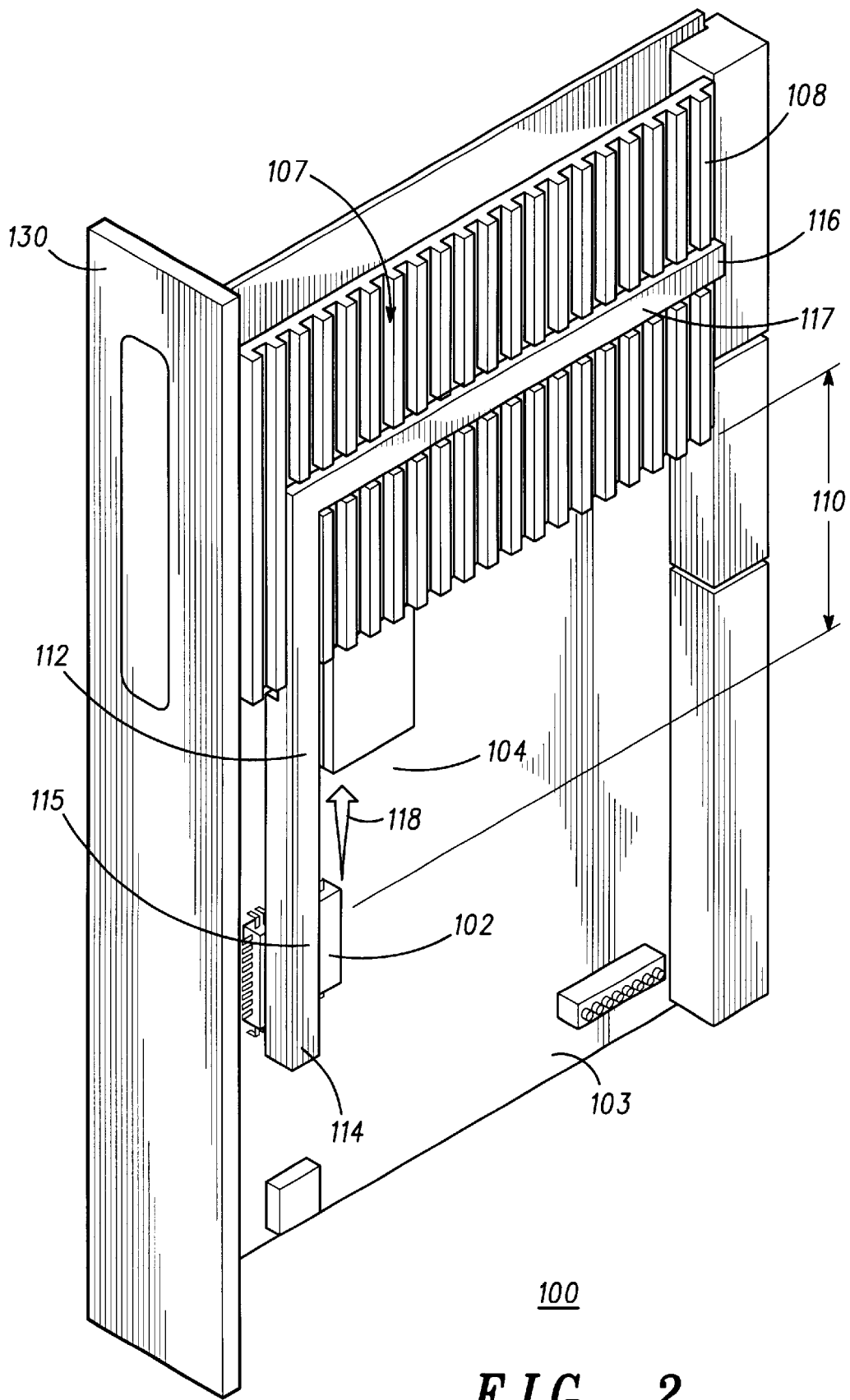
FIG. 2 is an isometric of an electronics module according to an embodiment of the invention.

FIG. 2 is an isometric of an electronics module 100 according to an embodiment of the invention. As shown in FIG. 2, a heat removal device 108 is mounted to electronics module 100. Heat removal device 108 is mounted to electronics module 100 at radial distance 110 from component 102 and substantially in the same plane as component 102. In an exemplary embodiment of the invention, heat removal device 108 is configured to (1) fasten to mezzanine card 106 of electronics module 100, (2) fasten to a mezzanine card site 107, or (3) occupy the physical space envelope of the mezzanine card. In a preferred embodiment mezzanine card site 107 is a CMC site, in which a CMC module is designed to occupy as defined by IEEE standard P1386.

In the embodiment shown in FIG. 2, heat removal device 108 is receives heat (Q) 118 from component 102 via heat conductor 112. A first portion 115 of heat conductor 112 is coupled to component 102 while a second portion 117 of heat conductor 112 is coupled to heat removal device 108. First portion 115 of heat conductor 112 comprises any surface area of heat conductor 112 proximate to the actual first end 114 of heat conductor 112. Second portion 117 of heat conductor 112 comprises any surface area of heat conductor 112 proximate to the actual second end 116 of heat conductor 112. The actual amount of first portion 115 and second portion 117 that must be coupled to or connected to component 102 and heat removal device 108, respectively, depends on the amount of heat (Q) 118 to be removed and can be readily determined by one of ordinary skill in the art. In the exemplary embodiment depicted in FIG. 2, heat conductor has an approximately square cross-section and is connected to component only along one side of heat conductor 112. Any cross-section, shape, size and dimension of heat conductor 112 is within the scope of the invention. The heat conductor 112 depicted in FIG. 2 is only an example and not meant to be limiting of the invention. Heat conductor 112 may comprise any means, material, apparatus, device, and the like, that conducts heat (Q) 118. An exemplary heat conductor 112 may be made of aluminum, copper, or other conventional heat conducting material. In another embodiment, heat conductor 112 can be a heat pipe, for example, a hollow structure with liquid, such as water, flowing through the structure in order to transfer heat (Q) 118.

Heat removal device 108 is depicted in FIG. 2 as a heat sink, which is not meant to be limiting of the invention. For example, heat removal device 108 may be any means, material, apparatus, device, and the like that is capable of receiving heat from component 102. In an exemplary embodiment of the invention, heat removal device 108 may be a standard heat sink made of a heat conducting material, for example, copper, aluminum, and the like. In another embodiment, heat removal device 108 may be one or more fans, a heat chimney, and the like. In still another embodiment, heat removal device 108 may be a thermoelectric cooler (TEC), which may include one or more solid-state heat pumps that utilize the Peltier effect. During operation, DC current flows through the TEC causing heat to be transferred from one side of the TEC to the other, creating a cold and hot side.

Figure 3:
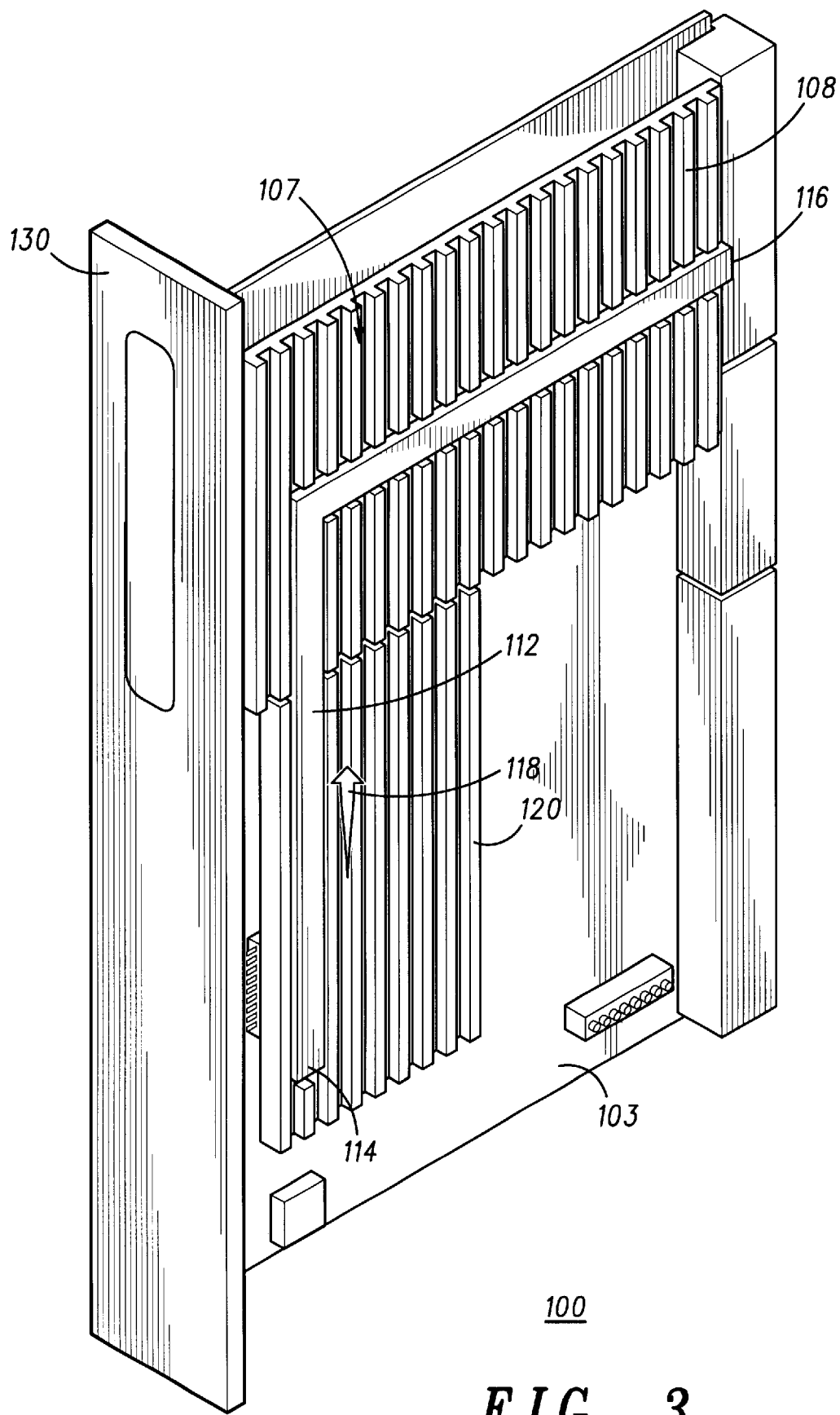
FIG. 3 is an isometric of an electronics module according to another embodiment of the invention.

FIG. 3 is an isometric of an electronics module 100 according to another embodiment of the invention. As shown in FIG. 3, a second heat removal device 120 is coupled to component 102 (not shown). In the present embodiment, second heat removal device 120 can be the same or a different type of heat removal device as discussed above. A portion of heat 118 can be removed by second heat removal device 120, with the remainder of heat 118 being received by heat removal device 108 via heat conductor 112. In another embodiment, second heat removal device 120 can act as heat conductor 112 with heat 118 being conducted by second heat removal device 120 to heat removal device 108.

Figure 4:
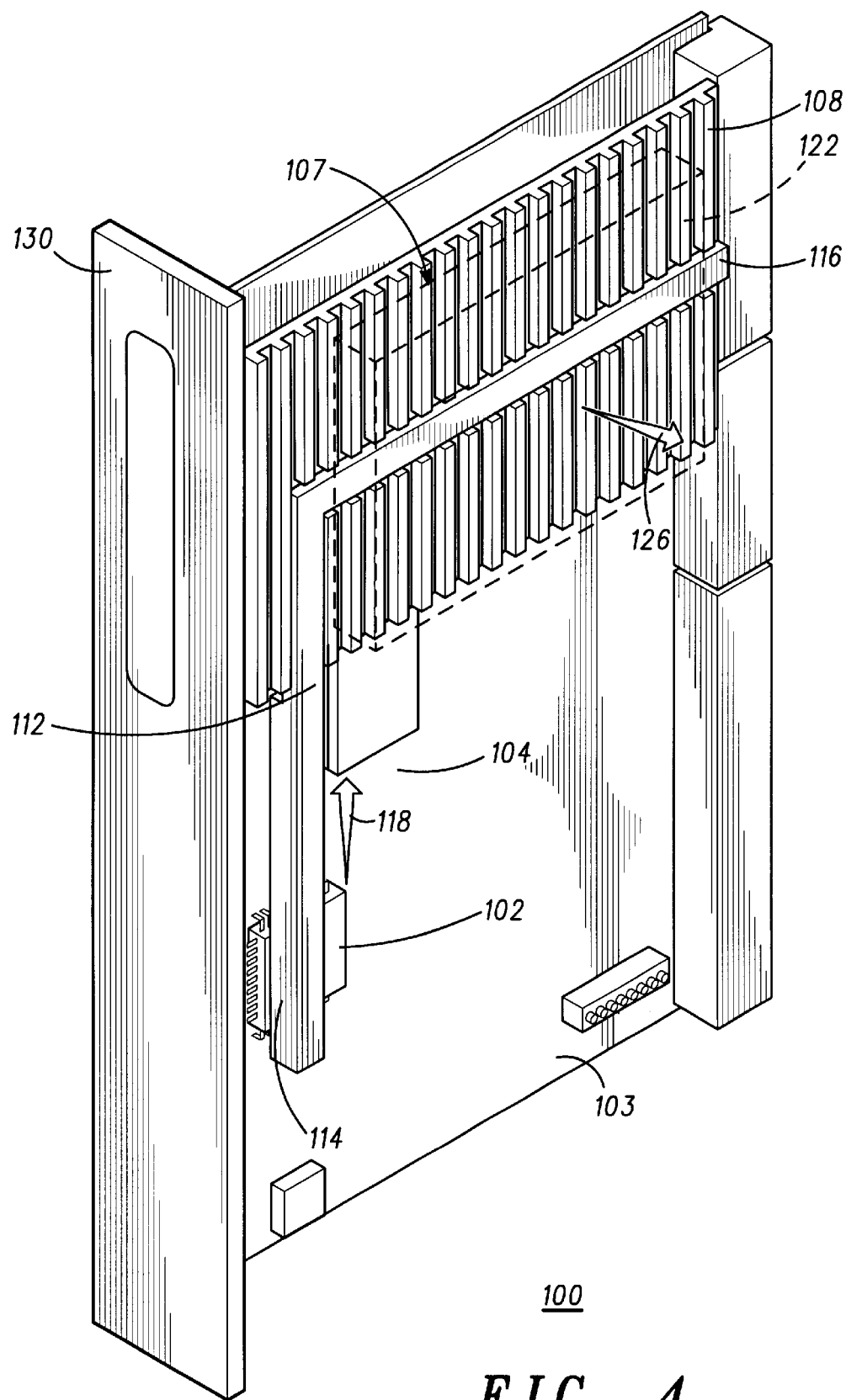
FIG. 4 is an isometric of an electronics module according to a further embodiment of the invention.

FIG. 4 is an isometric of an electronics module 100 according to a further embodiment of the invention. As shown in FIG. 4, a heat rejection device 122 may optionally be coupled to heat removal device 108. In this embodiment, heat from component 102 is received by heat removal device 108 with a portion of heat (Q) 126 dissipated by heat rejection device 122. In another embodiment, all of heat 118 or a portion of heat is rejected by heat rejection device 122 after passing through heat removal device 108. In the present embodiment, heat rejection device 122 may be one or more fans, a heat sink, heat pipe, heat chimney, piezoelectric cooler, and the like. Heat rejection device 122 is shown coupled to heat removal device 108, and such assembly is mounted on mezzanine card 106, fastened in a mezzanine card site 107 or configured to occupy the physical space envelope of mezzanine card 106.

Figure 5:
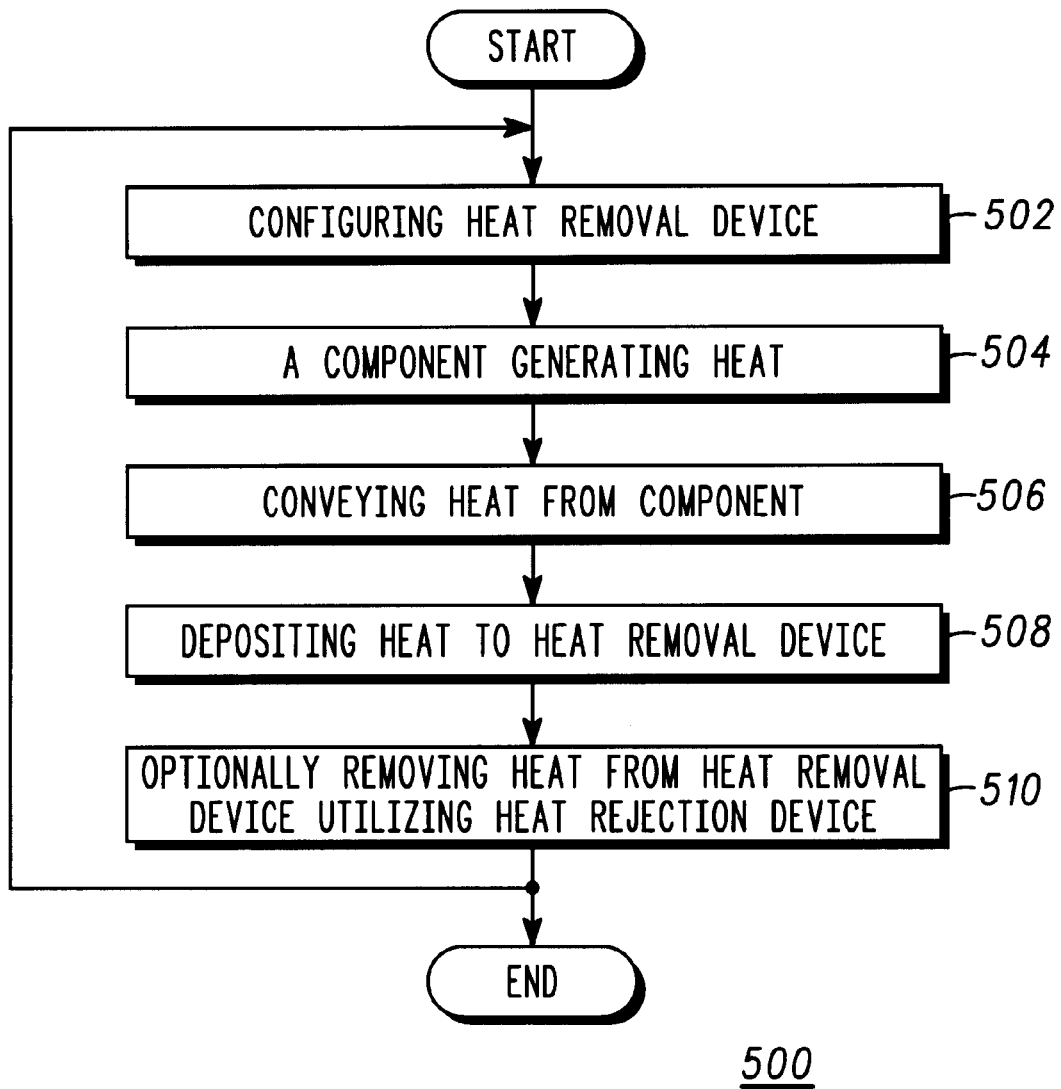
FIG. 5 is a flow chart of an embodiment of the invention.

FIG. 5 is a flow chart 500 of an embodiment of the invention. In step 502, heat removal device 108 is configured to fasten to mezzanine card 106 on electronics module 100, fasten to mezzanine card site 107 or is configured to occupy to the physical space envelope of mezzanine card 106. In a preferred embodiment, heat removal device 108 is configured to fasten to a CMC site or occupy CMC physical space envelope, and in a particularly preferred embodiment, heat removal device is configured to fasten to a PMC module site on electronics module 100.

In step 504, component 102 generates heat. In step 506, heat 118 is conveyed from component 102 to heat removal device 108. In one embodiment, heat 118 is conveyed via heat conductor 112. In step 508, heat 118 is deposited to heat removal device 108 mounted to electronics module 100. In an embodiment, heat 118 is received by heat removal device 108. In step 510, an optional heat rejection device 122 removes heat from heat removal device 108. In one embodiment, heat rejection device 122 removes a portion of heat 126. In another embodiment, heat rejection device 122 removes all of heat 118. The method of the invention is repeated per the return arrow in FIG. 5.

The apparatus and method of the invention have the advantage of allowing additional heat removal means within the confines of an electronics enclosure that is directed specifically at one or more components. The invention also has the advantage of being configured to fasten within an existing mezzanine card physical space envelope. Yet another advantage of the invention is the ability to reduce the main cooling system in an electronics enclosure thereby increasing efficiency and reducing overall cooling costs.

While we have shown and described specific embodiments of the present invention, further modifications and improvements will occur to those skilled in the art. It is therefore, to be understood that appended claims are intended to cover all such modifications and changes as fall within the true spirit and scope of the invention.

What is claimed is:

1. In an electronics module, an apparatus for removing heat from a component located on a surface of said electronics module, comprising;

a host board;

a front panel coupled to the host board, wherein the host board and the front panel define a physical space envelope of a mezzanine card;

a heat removal device mounted to the electronics module, wherein the component is located a radial distance from the heat removal device, wherein the heat removal device fastens to a mezzanine card site on the electronics module, and wherein the heat removal device occupies the physical space envelope of the mezzanine card; and a heat conductor having a first portion coupled to the component and having a second portion coupled to the heat removal device.

2. The apparatus of claim 1, wherein the heat removal device fastens to a mezzanine card on the electronics module.

3. The apparatus of claim 1, wherein the heat removal device fastens to a CMC card site on the electronics module.

4. The apparatus of claim 1, wherein the heat removal device fastens to a PMC module site on the electronics module.

5. The apparatus of claim 1, wherein the heat removal device receives heat from the component.

6. The apparatus of claim 1, further comprising a heat rejection device coupled to the heat removal device.

7. An electronic device, comprising:

an electronics module having a component located on a surface of said electronics module;

a host board coupled to the electronics module;

a front panel coupled to the host board, wherein the host board and the front panel define a physical space envelope of a mezzanine card;

a heat removal device mounted to the electronics module, wherein the component is located a radial distance from the heat removal device, wherein the heat removal device fastens to a mezzanine card site on the electronics module, and wherein the heat removal device occupies the physical space envelope of the mezzanine card; and a heat conductor having a first end coupled to the component and having a second end coupled to the heat removal device.

8. The electronic device of claim 7, wherein the heat removal device fastens to a mezzanine card on the electronics module.

9. The electronic device of claim 7, wherein the heat removal device fastens to a CMC card site on the electronics module.

10. The electronic device of claim 7, wherein the heat removal device fastens to a PMC module site on the electronics module.

11. The electronic device of claim 7, wherein the heat removal device receives heat from the component.

12. The electronic device of claim 7, further comprising a heat rejection device coupled to the heat removal device.

13. In an electronics module, a method for removing heat from a component located on a surface of said electronics module, comprising:

providing a host board;

providing a front panel coupled to the host board, wherein the host board and the front panel define a physical space envelope of a mezzanine card;

the component generating heat;

conveying the heat from the component by way of a heat conductor; and depositing the heat to a heat removal device mounted to the electronics module, wherein the heat removal device fastens to a mezzanine card site on the electronics module, and wherein the heat removal device occupies the physical space envelope of the mezzanine card.

14. The method of claim 13, further comprising the heat removal device fastening to a mezzanine card on the electronics module.

15. The method of claim 13, further comprising the heat removal device fastening to a CMC card site on the electronics module.

16. The method of claim 13, further comprising the heat removal device fastening to a PMC module site on the electronics module.

17. The method of claim 13, wherein depositing the heat comprises the heat removal device receiving heat from the component.

18. The method of claim 13, further comprising removing heat from the heat removal device utilizing a heat rejection device.

* * * * *